United States Patent
Ogliari et al.

(10) Patent No.: US 10,815,585 B2
(45) Date of Patent: Oct. 27, 2020

(54) SUSCEPTOR WITH SUBSTRATE CLAMPED BY UNDERPRESSURE, AND REACTOR FOR EPITAXIAL DEPOSITION

(71) Applicant: LPE S.p.A., Baranzate (IT)

(72) Inventors: Vincenzo Ogliari, Baranzate (IT); Silvio Preti, Baranzate (IT)

(73) Assignee: LPE S.P.A., Baranzate (MI) (IT)

( * ) Notice: Subject to any disclaimer, the term of this patent is extended or adjusted under 35 U.S.C. 154(b) by 251 days.

(21) Appl. No.: 16/087,174

(22) PCT Filed: Mar. 20, 2017

(86) PCT No.: PCT/IB2017/051599
§ 371 (c)(1),
(2) Date: Sep. 21, 2018

(87) PCT Pub. No.: WO2017/163168
PCT Pub. Date: Sep. 28, 2017

(65) Prior Publication Data
US 2019/0062946 A1    Feb. 28, 2019

(30) Foreign Application Priority Data
Mar. 24, 2016   (IT) .................. 102016000030964

(51) Int. Cl.
*C30B 25/12*   (2006.01)
*C23C 16/458*   (2006.01)

(52) U.S. Cl.
CPC .......... *C30B 25/12* (2013.01); *C23C 16/4584* (2013.01); *C23C 16/4586* (2013.01)

(58) Field of Classification Search
CPC .. C30B 25/12; C23C 16/4584; C23C 16/4586
See application file for complete search history.

(56) References Cited

U.S. PATENT DOCUMENTS

| | | |
|---|---|---|
| 2002/0069820 A1 | 6/2002 | Yudovsky |
| 2008/0236479 A1 | 10/2008 | Kiku et al. |
| 2015/0240358 A1 | 8/2015 | Kim et al. |

FOREIGN PATENT DOCUMENTS

| | | |
|---|---|---|
| CN | 105355584 A | 2/2016 |
| WO | WO9326038 A1 | 12/1993 |
| WO | WO0107691 A1 | 2/2001 |

*Primary Examiner* — Yuechuan Yu
(74) *Attorney, Agent, or Firm* — King & Schickli, PLLC

(57) ABSTRACT

The susceptor for an epitaxial deposition reactor comprises a disc-shaped portion (11, 12) which is adapted to be placed horizontally and which at the top has at least one cylindrical pocket (200) where a substrate (100) to be subjected to an epitaxial deposition process is placed; the pocket (200) has a bottom; one or more conduits (13) fluidically connected to an intake system (300) open on the bottom of the pocket (200); when a substrate (100) is placed on the bottom of the pocket (200) and the intake system (300) is active, the substrate (100) remains adhering to the bottom of the pocket (200). In particular: the upper body 12) superiorly has the pocket (200), the conduits (13) vertically cross only the upper body (12), the conduits (13) are fluidically connected to a plenum (14) located between the lower body (11) and the upper body (12) below the pocket (200), the plenum (14) is fluidically connected to the intake system (300); whereby when a substrate (100) is placed on the bottom of the pocket (200) and the intake system (300) is active, the lower body (11) and the upper body (12) remain united.

15 Claims, 2 Drawing Sheets

Figure 3:
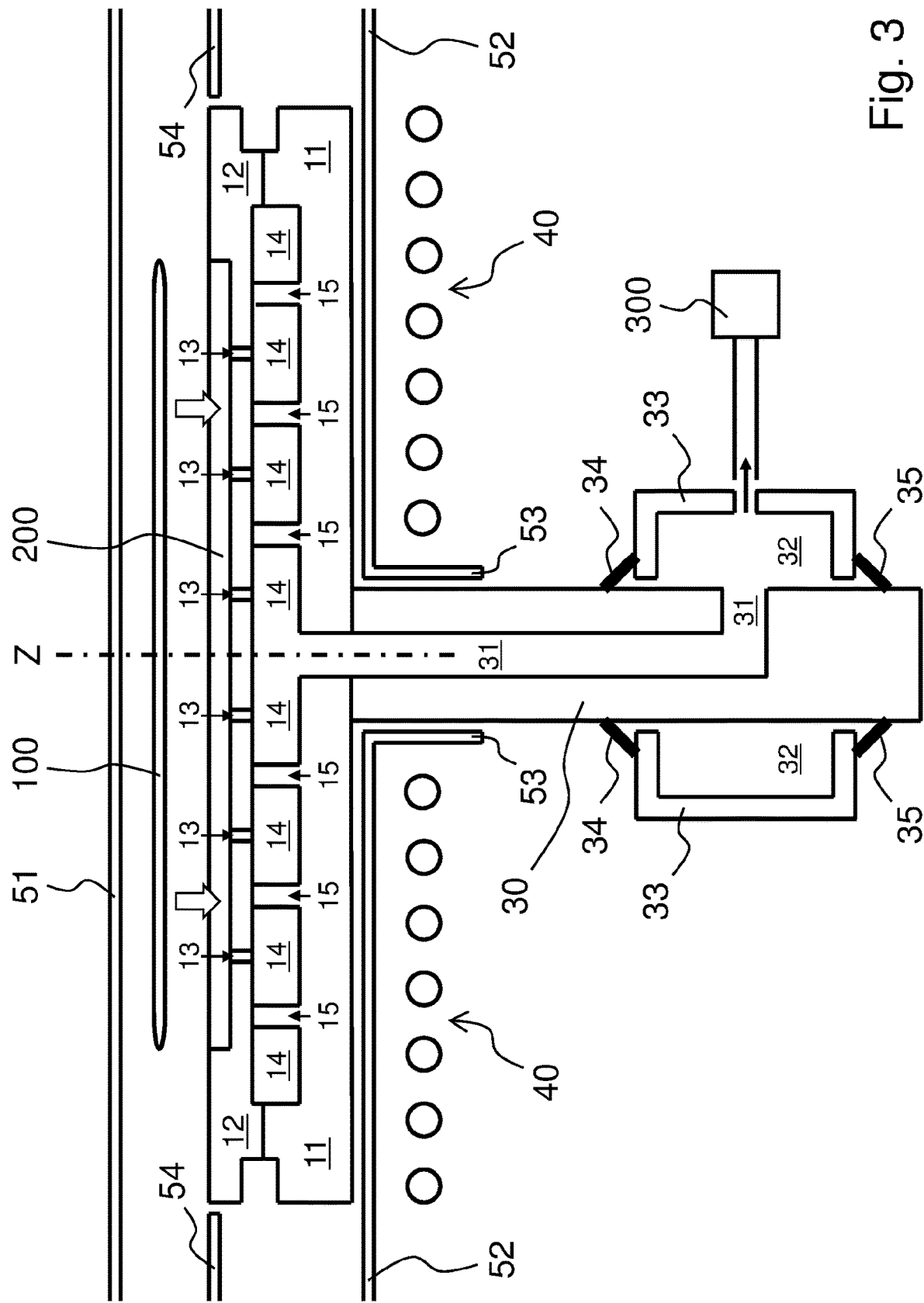

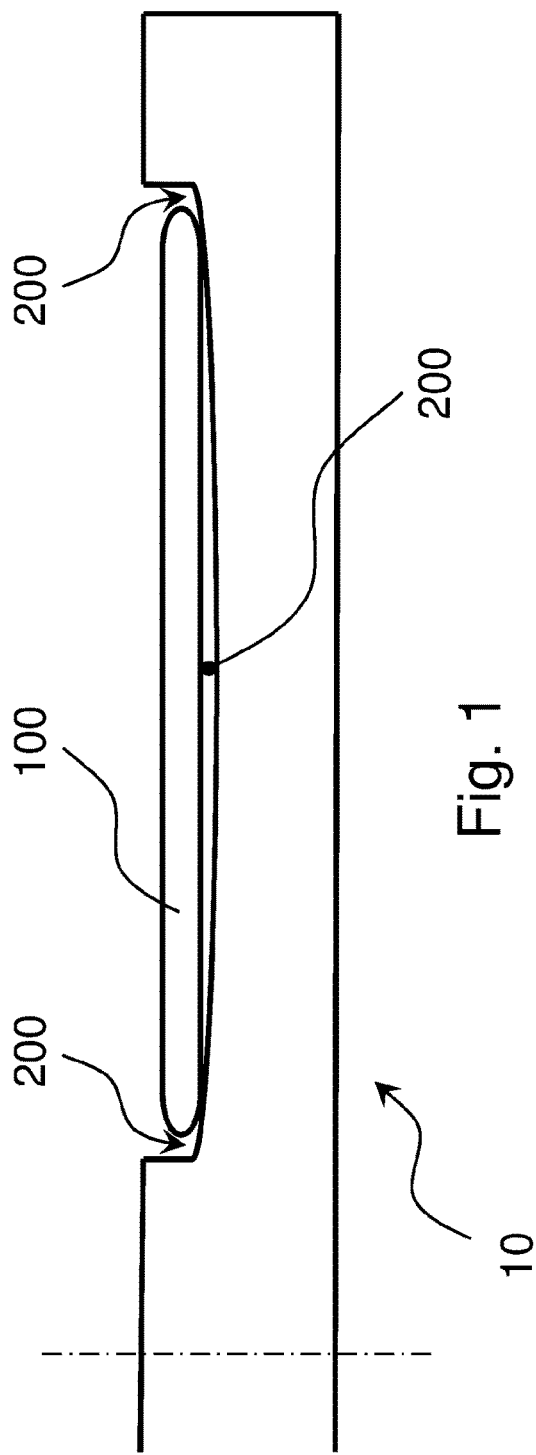
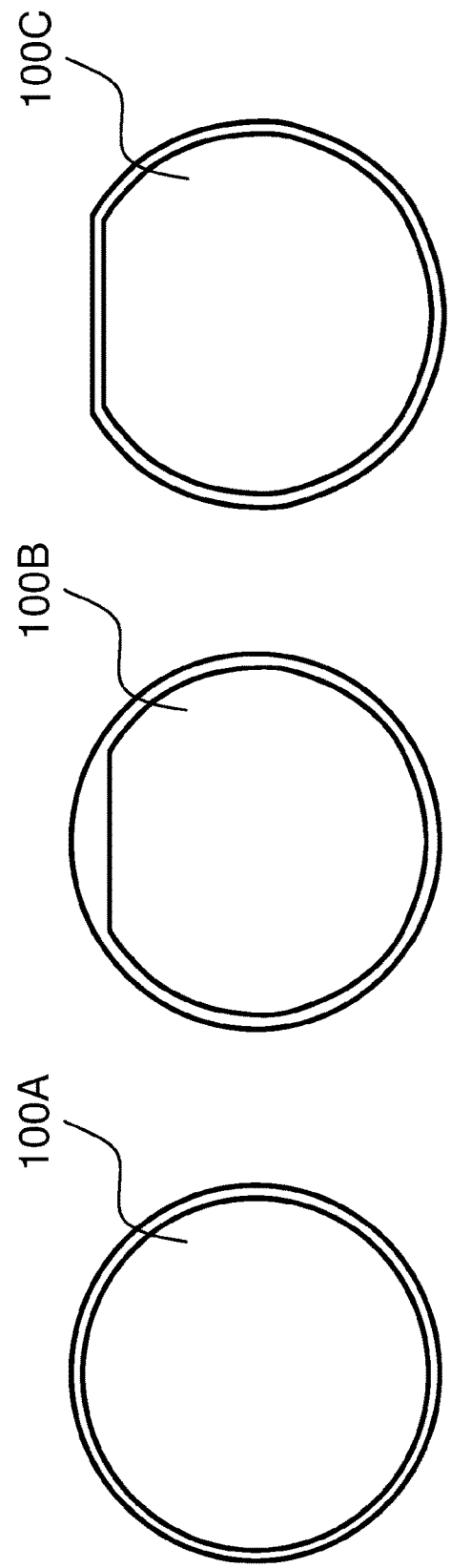

SUSCEPTOR WITH SUBSTRATE CLAMPED BY UNDERPRESSURE, AND REACTOR FOR EPITAXIAL DEPOSITION

FIELD OF THE INVENTION

The present invention relates to a susceptor for an epitaxial deposition reactor and an epitaxial deposition reactor comprising such a susceptor.

PRIOR ART

In the reaction chamber of a reactor for epitaxial deposition on substrates (also referred to as "wafers"), having a disc-shaped susceptor (see, for example, element 10 in FIG. 1) which serves for horizontally supporting one or more disc-shaped substrates (100 in FIG. 1) and which is associated with a heating system (see, for example, element 40 in FIG. 3), it is common to accommodate the disc-shaped substrates (100 in FIG. 1) within pockets (200 in FIG. 1) of the susceptor (10 in FIG. 1). The bottom of said pockets is suitably shaped and the depth is appropriate, generally comparable to the thickness of the substrates. The thickness of the susceptor is much greater than the thickness of the substrates, generally at least ten times greater.

At room temperature, the substrates are generally flat in shape.

During treatment in the reactor, however, faced with differences of temperature (for example in the direction of the thickness of a substrate and/or in the direction of the radius of a substrate), the substrates undergo deformation, in particular they take non-planar shapes. This happens for example during transients, when the substrates are heated from low temperature (such as room temperature) to high temperature (such as deposition temperature) and when they are cooled, or during the epitaxial growth due to, for example, thickness variation caused by the deposition itself.

The temperature difference between the two sides of the substrate depends primarily on the heating system used (such as lamps, resistors, induction).

In the specific case of an induction reactor, the substrate surface that is closer to the susceptor (i.e. in total or partial contact therewith) is hotter than the substrate surface that is farther from the susceptor (i.e. opposite), and the substrate takes roughly the shape of the surface of a spherical cap with convexity facing the susceptor. Such deformation increases if and when the substrate is in contact with the susceptor only in a central area of the substrate, which also leads to a radial temperature difference in the substrate.

In this case, pockets with shaped bottom are used, in particular concave, rather than flat (like the substrates). By suitably shaping the shape of the bottom of the pocket, better contact between substrate and pocket is ensured during treatment in the reactor and thus greater temperature uniformity of the substrate. Such a solution consists in adapting the shape of the susceptor and especially in particular of the pocket(s) to the shape taken by the substrate for limiting temperature differences in the substrate.

In general, the temperature differences in the substrate during its treatment in the reactor lead to thermal stresses and thermal stresses lead to defects in the crystallographic and electrical properties of the substrate treated.

According to the prior art, the pockets of the susceptor (10 in FIG. 1) may be, for example, as shown in FIG. 2; the pocket in FIG. 2A has a peripheral shape corresponding to a circumference (i.e. is almost perfectly cylindrical) and is adapted to accommodate a substrate 100A almost perfectly cylindrical; the pocket in FIG. 2B has a peripheral shape corresponding to a circumference (i.e. is almost perfectly cylindrical) and is designed to accommodate a cylindrical substrate 100B with a small lateral flat (i.e. it is substantially cylindrical); the pocket in FIG. 2C has a peripheral shape corresponding to a circumference with a small flat (i.e. is substantially cylindrical) and is adapted to accommodate a cylindrical substrate 100C with a small lateral flat (i.e. it is substantially cylindrical).

SUMMARY

According to the present invention, it is important that contact between substrate and susceptor (within the pocket) is regular and uniform so that heating of the substrate is uniform, in particular to prevent crystallographic defects in the substrates treated by the reactor.

Preferably, such a contact must be regular and uniform both during heating of the substrate and during the epitaxial deposition process on the substrate and during the cooling of the substrate.

In addition, it is preferable that there is no contact between the (outer) edge of the substrate and the (inner) edge of the pocket both during heating of the substrate and during the epitaxial deposition process on the substrate and during the cooling of the substrate. In fact, the edge of the pocket generally takes a higher temperature at the edge of the substrate and a possible contact between the two edges (at one or more points) would result in a non-uniformity of the temperature of the substrate.

Such objects are achieved by the susceptor having the technical features of the appended claims which are an integral part of the present description.

The idea underlying the present invention is to adapt the substrate to the shape of the bottom of the pocket, and not vice versa.

By gripping the substrate on the susceptor by means of depression, during treatment, the contact between substrate and susceptor is and remains regular and uniform. Therefore, the substrate undergoes none or limited thermal stresses and consequently has none or few crystallographic defects.

It should be noted that the above technical teaching was conceived in relation to horizontal pockets and disc-shaped susceptors and is preferably applied in these cases.

Moreover, it should be noted that the above technical teaching was conceived in relation to disc-shaped susceptors separable in an upper portion and a lower portion, and is preferably applied in these cases. Typically, the upper portion is adapted to be inserted into the reaction chamber of the epitaxial reactor before the treatment of substrates and to be removed from the reaction chamber of the epitaxial reactor after the treatment of substrates.

Preferably, the bottom of the pocket (or pockets) of the susceptor is flat and the substrate remains flat during treatment.

Moreover, by gripping the substrate on the susceptor by means of depression, during all the treatment, the substrate cannot move laterally. Therefore, if there is no contact between the edge of the pocket and the edge of the substrate at the beginning of treatment, there will be no contact throughout the treatment.

A subject of the present invention is also a reactor for epitaxial deposition comprising such a susceptor.

LIST OF FIGURES

The present invention will become clearer from the following detailed description to be taken in conjunction with the accompanying drawings, in which:

FIG. 1 shows a vertical sectional view of a susceptor according to the prior art, FIG. 2 shows three top views of recesses of a susceptor according to the prior art, and FIG. 3 shows a vertical sectional view of an exemplary embodiment of a susceptor according to the present invention in a reaction chamber of an epitaxial reactor.

As it is easily understood, there are various ways to practically implement the present invention, which is defined in its main advantageous aspects by the appended claims.

DETAILED DESCRIPTION

FIG. 3 shows a vertical sectional view of an exemplary embodiment of a susceptor according to the present invention in a reaction chamber of an epitaxial reactor.

The susceptor comprises a disc-shaped portion which is adapted to be placed horizontally and which consists of two disc-shaped bodies resting on top of one another and always fixed to each other: a lower body 11 (e.g. made of graphite coated with SiC) and an upper body 12 (e.g. made of graphite coated with SiC).

The susceptor superiorly has at least one cylindrical pocket 200 (to be precise, substantially cylindrical), in particular a single pocket, on which a substrate 100 to be subjected to an epitaxial deposition process is placed.

In FIG. 3, the diameter of the disc-shaped portion can be for example about 400 mm, the diameter of the substrate can be for example about 300 mm and the diameter of the pocket can be for example just over 300 mm, such as 302 mm.

In this exemplary embodiment in FIG. 3, the reaction chamber is box-shaped and made entirely of quartz (such as clear quartz possibly totally or partly coated with material that reflects infrared rays); FIG. 3 partially shows an upper horizontal wall 51 of the chamber, partially a lower horizontal wall 52 of the chamber, entirely a vertical sleeve 53 of the chamber connected to wall 52 at a hole thereof; FIG. 3 also partially shows a (so-called) horizontal liner 54 of the chamber which partially precedes and partially follows the disc-shaped portion of the susceptor, in particular the upper body 12.

The lower body 11 and the upper body 12 are located within the chamber, in particular in the "reaction and deposition" area thereof, between wall 51 and wall 52 but closer to wall 52 so that the reaction gases flow between the upper surface of the upper body 12 and the lower surface of wall 51; liner 54 is superiorly horizontally aligned with the upper body 12 and contributes to inferiorly define a reaction gas flow channel.

A rotation shaft 30 is further provided, mechanically connected to the disc-shaped portion of the susceptor, in particular to the lower body 11 (alternatively, the body and the shaft may be made in a single piece); shaft 30 lies partly within sleeve 53.

In this exemplary embodiment in FIG. 3, the (substantial) symmetry axis of body 11 coincides with the (substantial) symmetry axis of body 12, with the (substantial) symmetry axis of shaft 30 and with a vertical axis Z of the reaction chamber, in particular the (substantial) symmetry axis of sleeve 53.

A reaction chamber like that partially shown in FIG. 3 is typically provided with a cooling system, in particular of the upper wall and of the lower wall; such a cooling can be accomplished by means of a flow of a fluid (e.g. liquid) for the lower wall and a flow of a fluid (e.g. gas and/or liquid) for the upper wall.

A reaction chamber like that partially shown in FIG. 3 is typically provided or associated with reflecting devices for reflecting, in whole or in part, in particular infrared radiation emitted by the disc-shaped portion of the susceptor when it is hot, especially during the epitaxial deposition processes.

A reaction chamber like that partially shown in FIG. 3 may be provided or associated with further temperature control devices (internal or external to the "reaction and deposition" area).

An epitaxial reactor with a reaction chamber like the one shown in FIG. 3 is typically provided with a system for handling the substrates to be treated and the substrates treated; the handling system may be adapted to directly handle the substrates or the substrate holders, such as the upper body 12. In FIG. 3, it can be seen that bodies 11 and 12 laterally have recesses (for example 5-15 mm deep) adapted to cooperate with a handling tool; typically, such a tool is adapted to insert the upper body of the susceptor with one (or more) substrates to be treated and to extract the upper body of the susceptor with one (or more) substrates treated.

An inductor 40 is further provided, in particular a flat inductor, adapted to heat by electromagnetic induction in particular the disc-shaped portion of the susceptor, i.e. bodies 11 and 12. The heating of substrate 100 manly takes place through conduction through the contact with the bottom of pocket 200 formed in the upper body 12. Inductor 40 is adjacent to (but not in contact with) the lower horizontal wall 52 of the reaction chamber.

In this exemplary embodiment in FIG. 3, the reaction chamber is superiorly free of inductors.

According to the present invention, the pocket (200 in FIG. 3) has a flat bottom (i.e. neither concave nor convex, in particular perfectly flat); on the bottom of the pocket (200 in FIG. 3), a plurality of conduits (13 in FIG. 3) fluidically connected to an intake system (300 in FIG. 3) opens; so when a substrate (100 in FIG. 3) is resting on the bottom of the pocket (200 in FIG. 3) and the intake system (300 in FIG. 3) is active, the substrate (100 in FIG. 3) remains adhering to the bottom of the pocket (200 in FIG. 3) regardless of the temperature of the various points of the substrate and of the disc-shaped portion of the susceptor, in particular of the upper body 12. It should be noted that in FIG. 3), substrate 100 in FIG. 3 is depicted lifted from pocket 200 only for clarity of the figure; the two arrows pointing downwards indicate that substrate 100 is placed on the bottom of pocket 200.

It should be noted that in FIG. 3, the disc-shaped portion of the susceptor, in particular the upper body 12, is adapted to receive and thus treat one substrate at a time in the single pocket thereof. Alternatively, the disc-shaped portion of the susceptor, in particular the upper body 12, may be provided with multiple pockets (with flat bottom) and thus be adapted to treat more substrates at a time.

As an indication, pocket 200 may have a uniform depth of 0.2-2.0 mm, the disc-shaped portion of the susceptor (i.e. the superimposed bodies 11 and 12) may have a thickness of 15-30 mm, the lower body 11 may preferably have an average thickness of 10-20 mm and the upper body 12 may preferably have an average thickness of 5-10 mm (the central area thereof is comparable to a cylinder).

Mainly, the intake system (300 in FIG. 3) is kept active at least during the heating of the substrate and the cooling of the substrate, that is, when the risk that the substrate may be deformed by temperature is greater. However, for added safety and/or for the sake of simplicity, it is preferable to keep it active also during the epitaxial deposition process on the substrate.

In this exemplary embodiment in FIG. 3, conduits 13 vertically cross only the upper body 12 and the mouths of conduits 13 are substantially evenly distributed on the bottom of pocket 200. As an indication, the mouths may be distributed with a density of 1 mouth every 10-100 cm$^2$ and they may have a diameter of 0.5-2.5 mm and may have a length of 5-8 mm; for example, 25 mouths may be provided on an area of 700 cm$^2$.

In this exemplary embodiment in FIG. 3, all conduits 13 are fluidically connected to a single plenum 14 below pocket 200 (which has a diameter equal to or, preferably, a diameter slightly larger than that of the pocket, such as 305-310 mm). Plenum 14 is cylindrical in shape and is rather slim; for example, it may have a thickness of 0.2-2.0 mm. Plenum 14 is located between the upper body 12 and the lower body 11; in particular, it can be partly formed within body 11 and partly within body 12 (as shown in FIG. 3) or entirely within body 11 (in this case, body 12 is almost flat at the bottom).

Since plenum 14 is in depression condition and is inferiorly confined by body 11 (which is heated to a high temperature, such as 1000° C. or even more) and superiorly by body 12 (which is heated to a high temperature, such as 1000° C. or even more), there may be a risk of crush (at least partially).

To prevent such a risk, in the exemplary embodiment in FIG. 3, plenum 14 preferably has reliefs 15 adapted to keep the lower body 11 and the upper body 12 at a distance at plenum 14; in this example, reliefs 15 are protrusions of the lower body 11. In particular, reliefs 15 (which act as spacers) are substantially evenly distributed within plenum 14; as an indication, a density of 1 relief every 10-100 cm$^2$ may be selected; for example, 15 reliefs may be provided in a surface of 750 cm$^2$. In particular, reliefs 15 (which act as spacers) may be inverted pyramid or truncated cones (for example with a diameter of 0.5-2.0 mm) (for example with a height of 0.2-2.0 mm). In this exemplary embodiment in FIG. 3, the disc-shaped portion of the susceptor is mechanically connected to a rotation shaft 30, and plenum 14 is fluidically connected to an intake conduit 31 within the rotation shaft 30 through a conduit of the lower body 11 (specifically a central hole). The intake chamber 31 is fluidically connected to an intake chamber 32 annular in shape located around the rotation shaft 30 under the disc-shaped portion of the susceptor, for example at a distance of 5-25 cm from the lower body 11. Chamber 32 is confined by a cylindrical wall 33 which is fixed; an upper seal 34 and a lower seal 35 are provided between the fixed wall 33 and the rotating shaft 30. Chamber 32 is fluidically connected to the intake system 300 which for example comprises a vacuum pump.

The intake system 300 is adapted to create a pressure difference between the upper face of the substrate (100 in FIG. 3) and the lower face of the substrate (100 in FIG. 3). This pressure difference may be, for example, of 0.1-10.0 kPa, preferably 0.5-2.5 kPa, during a treatment of the substrate (100 in FIG. 3). This difference in pressure is maintained at least during the heating of the substrate and the cooling of the substrate, and preferably also during the entire epitaxial deposition process on the substrate.

The reactor according to the present invention may be adapted to operate with a fixed pressure or a variable pressure in the reaction chamber of the reactor. The fixed pressure may be "atmospheric" (about 1000 mBar=100 kPa) or "reduced" (such as a pressure in the range of 50-950 mBar=5-95 kPa). If the pressure is variable, for example, the operator sets the pressure to carry out an epitaxial deposition onto a substrate; the adjustment range can be, for example, 50-1100 mBar=5-110 kPa.

The pressure difference to be used to grip a substrate must also take the pressure in the reaction chamber of the reactor into account.

Gripping the substrates on the susceptor using depression is one aspect of a method for treating substrates, which method also involves the epitaxial deposition on the substrates The substrates are handled before the epitaxial deposition (i.e. substrates to be treated) and after the epitaxial deposition (i.e. treated substrates).

It is preferable that a substrate is placed in the pocket in a position such that the edge of the substrate is not in contact with the edge of the pocket before depression is applied and that it remains substantially in such a position until depression is applied.

The invention claimed is:

1. Susceptor for a reactor for epitaxial deposition comprising a disc-shaped portion which is adapted to be placed horizontally and which at the top has at least one cylindrical pocket with a bottom where a substrate to be subjected to an epitaxial deposition process is placed, wherein one or more conduits fluidically connected to an intake system open on the bottom of the pocket, whereby when a substrate is placed on the bottom of the pocket and the intake system is active, the substrate remains adherent to the bottom of the pocket, wherein said disc-shaped portion consists of a lower body and an upper body, wherein said upper body is superiorly provided with said at least one pocket, wherein said one or more conduits vertically cross only said upper body, wherein said one or more conduits are fluidically connected to a plenum which is located between said lower body and said upper body below said at least one pocket, and said plenum is fluidically connected to said intake system, whereby when a substrate is placed on the bottom of the pocket and the intake system is active, said lower body and said upper body remain united.

2. Susceptor according to claim 1, wherein a plurality of conduits open on the bottom of said pocket.

3. Susceptor according to claim 1, comprising a plurality of spacers within said plenum adapted to prevent deformation of said plenum due to the intake.

4. Susceptor according to claim 1, wherein said lower body and/or said upper body have recesses and/or protrusions adapted to allow the handling of said upper body by a tool of a handling system of the reactor.

5. Susceptor according to claim 1, wherein said lower body has one or more conduits for fluidically connecting said plenum to said intake system.

6. Susceptor according to claim 1, wherein said plenum is formed only within said lower body.

7. Susceptor according to claim 1, wherein said bottom is flat.

8. Susceptor according to claim 1, wherein there is a plurality of mouths of conduits, and said mouths are evenly distributed on the bottom of the pocket.

9. Susceptor according to claim 1, wherein there is a plurality of conduits, and said conduits are fluidically connected to a single cylindrical plenum.

10. Susceptor according to claim 9, wherein said plenum is located at least below said at least one pocket and preferably has a horizontal extension corresponding to said pocket.

11. Susceptor according to claim 1, wherein said disc-shaped portion is mechanically connected to a rotation shaft.

12. Susceptor according to claim 11, where said plenum is fluidically connected to an intake conduit located within said rotation shaft.

13. Susceptor according to claim 12, wherein the intake conduit is fluidically connected to an annular-shaped intake chamber located around said rotation shaft below said disc-shaped portion.

14. Susceptor according to claim 1, wherein said intake system is adapted to generate a pressure difference between the upper face of the substrate and the bottom face of the substrate of 0.1-10.0 kPa, during a treatment of the substrate.

15. Reactor for epitaxial deposition comprising at least one susceptor according to claim 1.

* * * * *